United States Patent [19]
Hwang

[11] Patent Number: 5,563,010
[45] Date of Patent: Oct. 8, 1996

[54] EXPOSURE MASK

[75] Inventor: Joon Hwang, Kyungki-do, Rep. of Korea

[73] Assignee: Hyundai Electronics Industries Co., Ltd., Rep. of Korea

[21] Appl. No.: 402,633

[22] Filed: Mar. 13, 1995

[30] Foreign Application Priority Data

Nov. 3, 1994 [KR] Rep. of Korea .................... 1994 4736

[51] Int. Cl.⁶ ..................................................... G03F 9/00
[52] U.S. Cl. ................. 430/5; 430/322; 430/394
[58] Field of Search ................................ 430/5, 322, 394

[56] References Cited

U.S. PATENT DOCUMENTS 5,424,154 6/1995 Borodovsky ................................ 430/5

Primary Examiner—S. Rosasco
Attorney, Agent, or Firm—Merchant, Gould, Smith, Edell, Welter & Schmidt

[57] ABSTRACT

There is disclosed an exposure mask useful for a lithography process for semiconductor device. The exposure mask consists of a plurality of spaced apart light screen patterns and a plurality of spaced apart subsidiary patterns on a transparent substrate, each of the subsidiary patterns being positioned between the light screen patterns and at an area where a necking effect is expected upon a forming photosensitive film pattern over a deteriorated topology using a light exposure mask.

15 Claims, 5 Drawing Sheets

5,563,010

EXPOSURE MASK

BACKGROUND OF THE INVENTION

1. Field of the Invention

The present invention relates, in general, to exposure masks useful for lithography for semiconductor devices and, more particularly, to exposure masks with subsidiary patterns, which prevent a necking effect when photosensitive film patterns are formed over a deteriorated topology.

2. Description of the Prior Art

Usually, a photosensitive film pattern, used for attaining a desired pattern, is established by coating a photosensitive material on a surface and exposing it to light. The semiconductor device which is highly integrated and fine has a deteriorated topology on its semiconductor substrate. When the photosensitive film pattern is formed over the semiconductor substrate with such topology, undesirable parts of the photosensitive material may be exposed to light due to the fact that the deteriorated topology causes diffused deflection of the light. The photosensitive film pattern thus obtained is not the desired one but shows a so-called necking problem wherein the exposed parts are removed or cleaved.

In order to better understand the background of the present invention, a description for conventional technology will be given below in connection with the figures.

Referring to FIGS. 1A–1C, there is illustrated an example of the necking effect when a photosensitive film pattern formed by a conventional exposure mask is applied.

First, FIG. 1A shows a conventional exposure mask consisting of a light screen pattern 1 on a transparent substrate 100.

FIG. 1B shows a photosensitive film pattern 11 which is formed over a semiconductor substrate SO with a deteriorated topology. As shown in this figure, there is generated a necking effect 12 wherein a part of the photosensitive film pattern 11 is removed owing to the diffused reflection of light caused by the topology.

FIG. 1C is a cross section showing the necking effect, taken through line I—I of FIG. 1B. On the semiconductor substrate 50, there are sequentially formed a field oxide film 5, a gate electrode 7 and an oxide film 9. Thereafter, a conductive layer 10, for example, a metal layer, is deposited over the resulting structure. A photosensitive film is coated on the conductive layer, exposed to light by using the light exposure mask of FIG. 1A and developed into the photosensitive film pattern 11, for the purpose of patterning the conductive layer 10. As seen in FIG. 1C, the photosensitive film is thinly coated at an area where the topology of the conductive layer 10 is high and thus, the photosensitive film pattern 11 is apt to be removed at the high areas, leading to the necking effect. That is to say, since the thickness of the coated photosensitive film is different from one area to another depending on the pattern formed below the film, a thin region of the photosensitive film, is undesirably exposed by diffused reflection of light caused by the deteriorated topology if the intensity of light is controlled so as to expose the thick region of the photosensitive film.

Referring to FIGS. 2A–2B, there is illustrated another example of the necking effect when a photosensitive film pattern formed by a conventional exposure mask is applied.

First. FIG. 2A shows a conventional exposure mask consisting of a light screen pattern 3 longitudinally formed on a transparent substrate 100.

FIG. 2B shows a photosensitive film pattern 13 which is formed over a semiconductor substrate 50 with a deteriorated topology. The photosensitive film pattern 13 is formed by forming a U type conductive wiring 18 on a semiconductor substrate 50, depositing an insulation film (not shown) over the conductive wiring 18, depositing a metal layer (not shown) over the insulation film, coating a photosensitive film on the metal layer, exposing the photosensitive film to light using the exposure mask of FIG. 2A and developing the photosensitive film into the photosensitive film pattern 13 for the purpose of patterning the metal layer. The conductive wiring 18 which is formed below the metal layer makes the metal layer exhibit a topological difference. Owing to this, when light is illuminated on the photosensitive film, it is reflected from a slant face of the metal layer and removes a part of the photosensitive film pattern 13 at an area where the conductive wiring 18 is overlapped with the photosensitive film pattern 13. That is, there is generated a necking effect 14 at the overlap area.

When a photosensitive film pattern is formed by conventional techniques over a pattern or layer with a high reflectivity, such as a metal wiring with a deteriorated topology, there are usually generated such necking effects.

SUMMARY OF THE INVENTION

Therefore, the object of the present invention is to overcome the above problems encountered in the prior art and to provide exposure masks which prevent the necking effect and are capable of achieving an accurate dimension in the photosensitive film pattern.

In accordance with one embodiment of the present invention, there is provided an exposure mask consisting of a plurality of discrete light screen patterns and a plurality of discrete subsidiary patterns on a transparent substrate, each of the subsidiary patterns being positioned between the light screen patterns and at an area where a necking effect is expected upon forming a photosensitive film pattern over a deteriorated topology using a light exposure mask.

In accordance with another embodiment of the present invention, there is provided an exposure mask which consists of a plurality of discrete light screen patterns used to form a photosensitive film pattern over an uneven topology resulting from providing a U type conductive wiring on a semiconductor substrate, depositing an insulation layer over the conductive wiring, depositing a metal layer over the insulation layer and coating the metal layer with a photosensitive film in such a way that the metal layer may be patterned after the photosensitive film pattern and the resulting metal pattern may overlap the conductive wiring at inner sides of the opposite ends, characterized by the improvement that a subsidiary pattern is provided both between the light screen patterns and beside the ends of the conductive wiring to reduce the intensity of an incident light passing therethrough, whereby incident light can be prevented from being diffuse-reflected from a slant face of the topology.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENTS

Figure 1A:
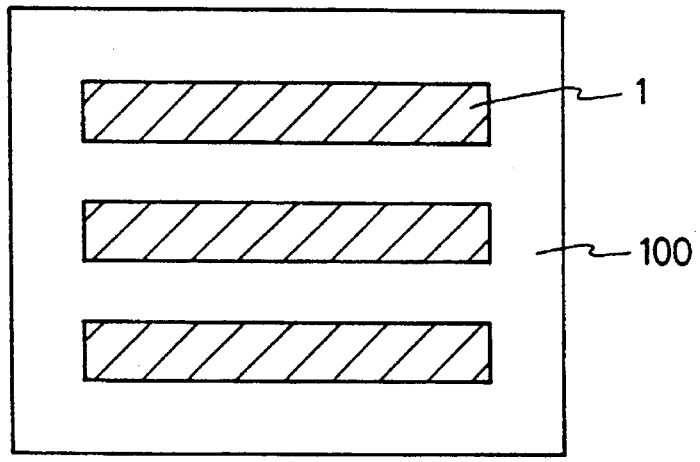
FIG. 1A is a schematic top view showing a conventional exposure mask.
Figure 1B:
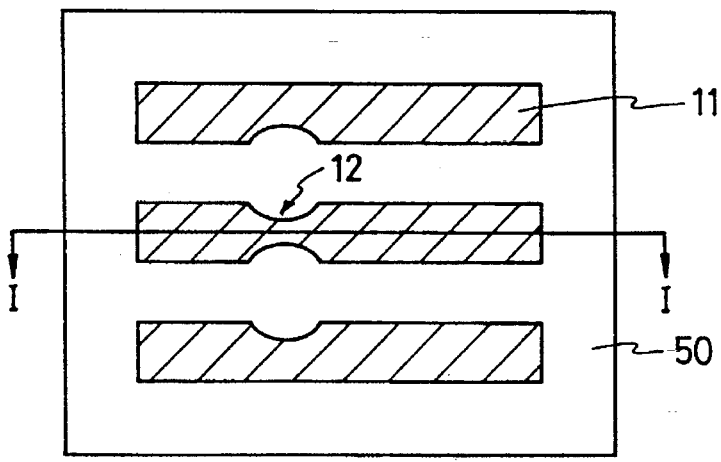
FIG. 1B is a schematic top view showing a photosensitive film pattern formed by use of the exposure mask of FIG. 1A.
Figure 1C:
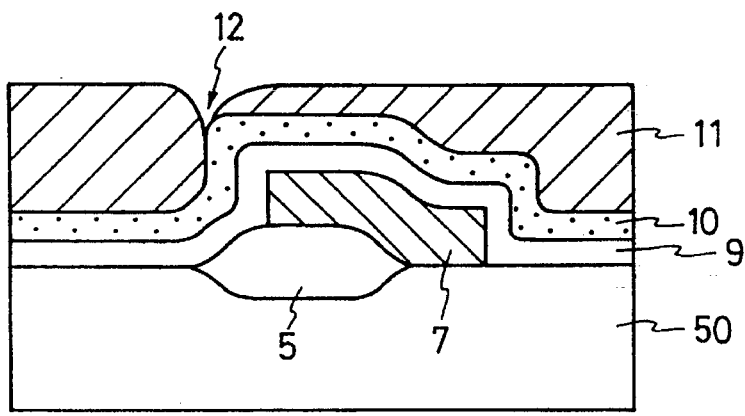
FIG. 1C is a schematic cross sectional view showing a photosensitive film pattern having a necking effect over a deteriorated topology, taken through line I—I of FIG. 1B.
Figure 2A:
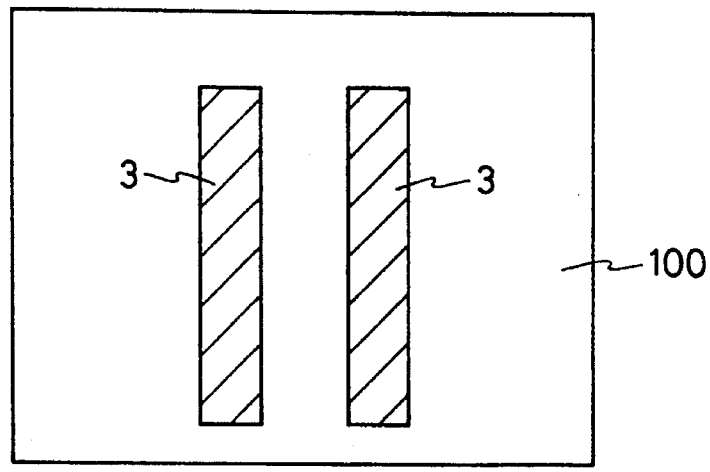
FIG. 2A is a schematic top view showing another conventional exposure mask.
Figure 2B:
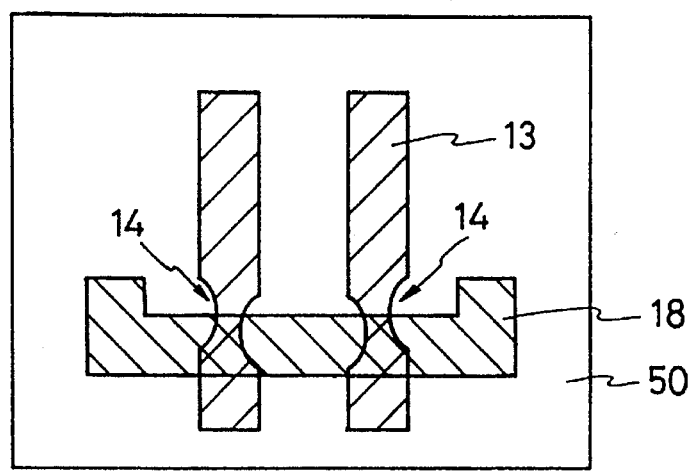
FIG. 2B is a schematic top view showing a photosensitive film pattern with a necking effect at the overlapped area with a lower pattern, formed by use of the exposure mask of FIG.

The application of the preferred embodiment of the present invention is best understood by referring to the accompanying drawings, wherein like reference numerals are used for like and corresponding parts of the drawings, respectively.

Figure 3A:
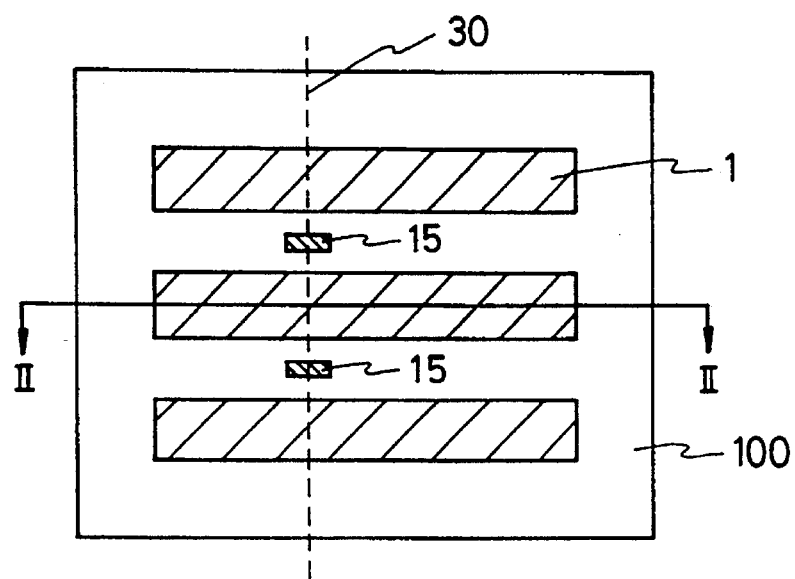
FIG. 3A is a schematic top view showing an exposure mask according to a first embodiment of the present invention.

Referring initially to FIG. 3A, there is shown on exposure mask according to a first embodiment of the present invention. It consists of a plurality of light screen patterns 1 provided with a subsidiary pattern 15 therebetween on a transparent substrate 100, The subsidiary patterns 15 are formed from a chrome layer or a phase shifter at an area 30 where the necking effect is generated in the conventional techniques, such that the intensity of the light passing between the light screen patterns I may be reduced. Herein, the subsidiary pattern 15 has a dimension depending on that of the light screen pattern 15, and is typically about 0.1 to 0.2 μm wide and about 0.3 to 0.5 μm long. The photosensitive film pattern attributable to the subsidiary pattern 15 is not formed because the subsidiary pattern is reduced to one-fifth when exposed to light and reflected upon the semiconductor substrate. In addition, it can be properly adjusted by using the inclination and height of the topology.

Figure 3B:
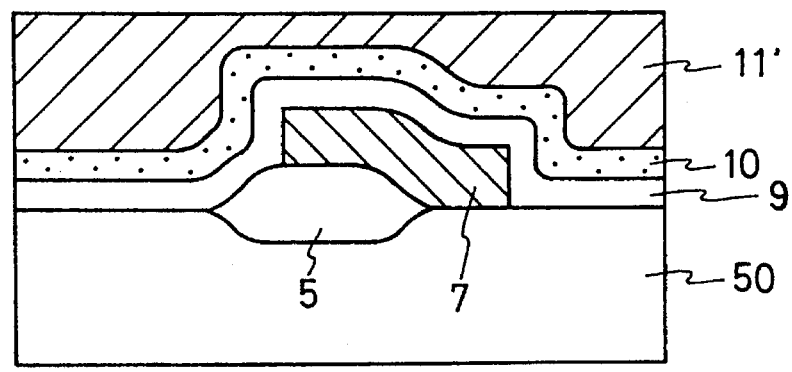
FIG. 3B is a schematic cross sectional view taken along line II—II of FIG. 3A, showing a photosensitive film pattern without a necking effect, formed by use of the exposure mask of FIG. 3A over a deteriorated topology.

FIG. 3B is a cross section showing a photosensitive film pattern which is formed by using the exposure mask of Fig, 3A, taken through line II—II of FIG. 3A. On a semiconductor substrate 50, there are sequentially formed a field oxide film 5, a gate electrode 7 and an oxide film 9. Thereafter, a conductive layer 10, for example, a metal layer, is deposited over the resulting structure. A photosensitive film is coated on the conductive layer 10, exposed to light using the light exposure mask of FIG. 3A and developed into a photosensitive film pattern 11', for the purpose of patterning the conductive layer 10. There is not generated a necking effect in the photosensitive film pattern 11' by virtue of the subsidiary pattern 15 which reduces the intensity of light incident at an area having a deteriorated topology and, thus, the intensity of the diffuse-reflected light.

Figure 4A:
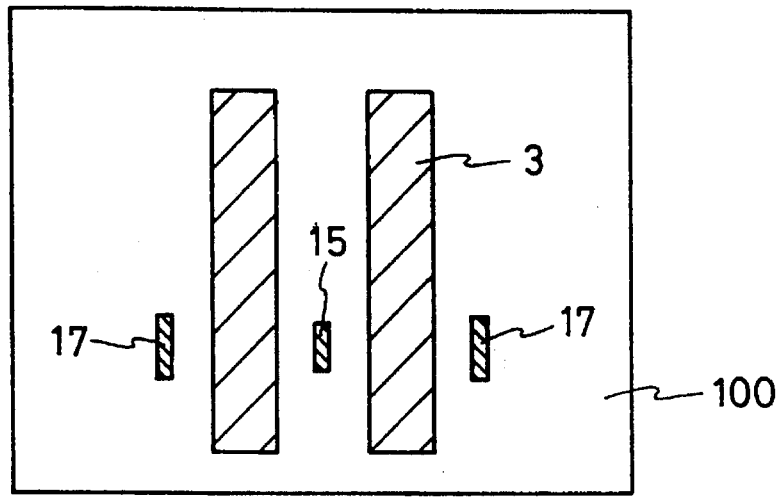
FIG. 4A is a schematic top view showing an exposure mask according to a second embodiment of the present invention.

Referring to FIG. 4A, there is shown an exposure mask according to a second embodiment of the present invention. It consists of a plurality of light screen patterns 3 on a transparent substrate 100 provided with a first subsidiary pattern 15 therebetween and a second subsidiary pattern 17 beside the first and the last light screen patterns. The subsidiary patterns ale formed from a chrome layer or phase shifter at an area where the necking effect is expected to occur in the conventional techniques, such that the intensity of light passing between the light screen patterns 1 may be reduced. In consideration of the width of the light screen patterns 15 and 17, the first subsidiary patterns 15 are preferably about 0.1 to 0.2 μm wide and about 0.3 to 0.5 μm long, whereas the second subsidiary patterns 17 are preferably about 0.1 to 0.2 μm and about 0.4 to 0.8 μm. In addition, they can be properly adjusted by using the inclination and height of the topology.

Figure 4B:
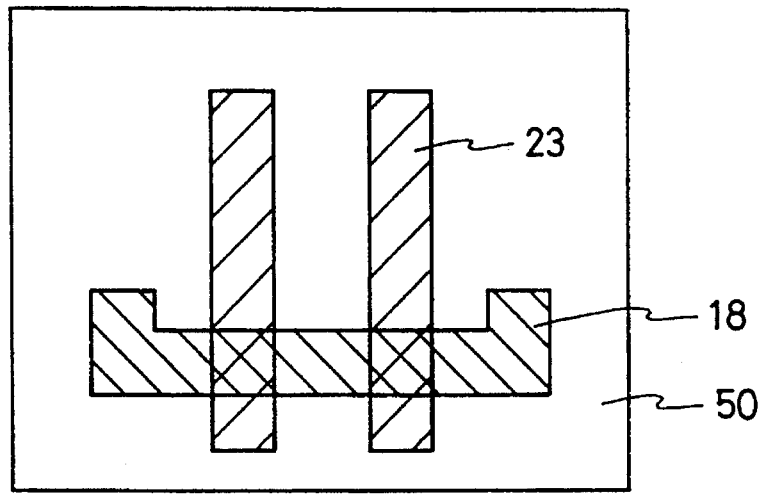
FIG. 4B is a schematic top view showing a photosensitive film pattern without a necking effect, formed by use of the exposure mask of FIG. 4A over a deteriorated topology.

FIG. 4B shows a photosensitive film pattern 23 which is formed over a semiconductor substrate 50 with a deteriorated topology, and which is free of the necking effect. The photosensitive film pattern 23 is formed by forming a U type conductive wiring 18, for example polysilicon wiring, on a semiconductor substrate 50, depositing a metal layer (not shown) over the conductive wiring 18, coating a photosensitive film on the metal layer, exposing the photosensitive film to light using of the exposure mask of FIG. 4A and developing the photosensitive film into the photosensitive film pattern 23 for subsequent patterning of the metal layer.

Figure 5A:
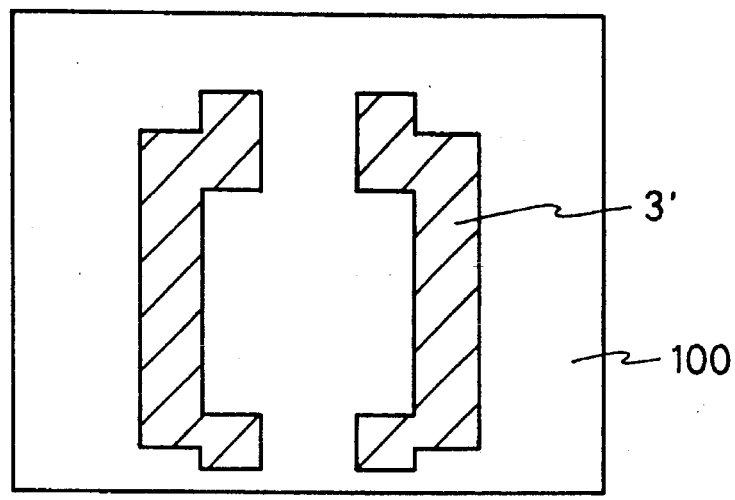
FIG. 5A is a schematic top view showing an exposure mask according to a third embodiment of the present invention.

Turning now to FIG. 5A, there is shown an exposure mask according to a third embodiment of the present invention. It consists of a plurality of light screen patterns 3' with a bracket-line shape "[ ]" on a transparent substrate 100.

Figure 5B:
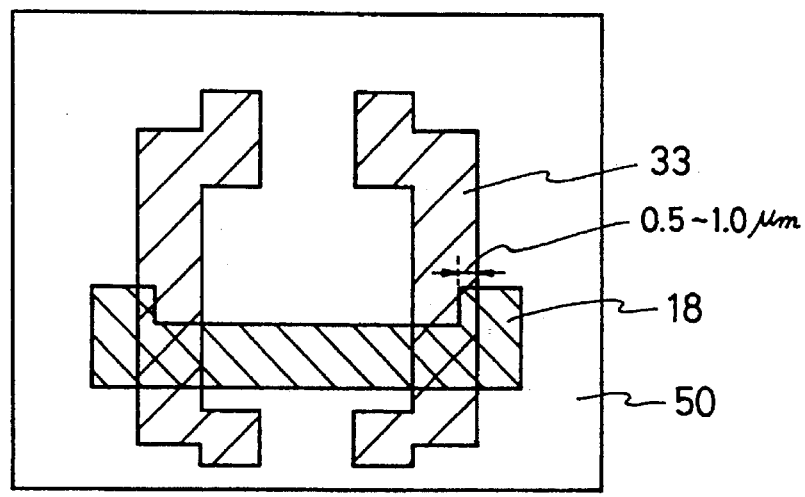
FIG. 5B is a schematic top view showing a photosensitive film pattern without a necking effect, formed by use of the exposure mask of FIG. 5A over a deteriorated topology.

FIG. 5B shows a photosensitive film pattern 33 which is formed over a semiconductor substrate 50 with a deteriorated topology, and which is free of the necking effect. The photosensitive film pattern 33 is formed by forming a U type conductive wiring 18 on a semiconductor substrate 50, depositing an insulation layer (not shown) over the conductive wiling 18, depositing a metal layer (not shown) over the insulation layer, coating a photosensitive film on the metal layer, exposing the photosensitive film to light using of the exposure mask of FIG. 5A and developing the photosensitive film into the photosensitive film pattern 33 for the purpose of patterning the metal layer. When the photosensitive film is exposed to light, the light screen pattern with the bracket-shape "[ ]" is aligned in such a way that it may overlap with the conductive wiring 18 at the opposite ends thereof. By virtue of the overlap, the necking effect can be prevented. The dimension of the overlap between the photosensitive film pattern 33 and the conductive wiring 18 is about 0.5 to 1.0 μm wide. In addition, since the neighboring photosensitive film patterns 33 are more distant from each other due to their bracket-shape "[ ]", there is no necking effect generated at the insides of the photosensitive film patterns.

As described hereinbefore, the exposure masks with subsidiary patterns or a bracket-shape "[ ]" according to the present invention are able to form photosensitive film patterns having an accurate width and prevent the necking effect from occurring. Accordingly, the exposure masks of the present invention die useful for high integration of semiconductor devices as well as for the improvement in productivity and reliability.

Other features, advantages and embodiments of the invention disclosed herein will be readily apparent to those exercising ordinary skill after reading the foregoing disclosure. In this regard, while specific embodiments of the invention have been described in considerable detail, variations and modifications of these embodiments can be effected without departing from the spirit and scope of the invention as described and claimed.

What is claimed is:

1. An exposure mask, having a transparent substrate, for use with photosensitive film overlaying a layer having a deteriorated topology, the mask comprising:

a plurality of light screen patterns On the substrate and a plurality of subsidiary patterns on the transparent substrate, each of the subsidiary patterns being disposed between the light screen patterns and at a position where a necking effect is expected upon forming a pattern in the photosensitive film using the light mask.

2. An exposure mask in accordance with claim 1, wherein said subsidiary patterns ale formed from a chrome layer or phase shifter.

3. An exposure mask in accordance with claim 1, wherein the subsidiary patterns are so small as to not form a photosensitive film pattern attributed to them.

4. An exposure mask in accordance with claim 3, wherein the subsidiary patterns are about 0.1 to 0.2 µm wide and about 0.3 to 0.5 µm long.

5. A method of forming a photosensitive pattern over an uneven topology using an exposure mask which comprises a plurality of light screen patterns, the method comprising the steps of:

providing a U type conductive wiring on a semiconductor substrate;

depositing an insulation layer Over the conductive wiring;

depositing a metal layer over the insulation layer; and coating the metal layer with a photosensitive film; and exposing the photosensitive film with a pattern for transferring to the metal film, so that the resulting metal layer pattern may overlap the conductive wiring at inner sides of opposite ends;

wherein the exposure mask has subsidiary patterns provided between the light screen patterns and also beside the ends of the conductive wiring to reduce the intensity of incident light passing therethrough, so that incident light is prevented from being diffuse-reflected from a slant face of the uneven topology in the exposing step.

6. An exposure mask in accordance with claim 5, wherein said subsidiary patterns are formed from a chrome layer or a phase shifter.

7. An exposure mask in accordance with claim 5, wherein the subsidiary patterns are so small as to not form a photosensitive film pattern attributed to them.

8. An exposure mask in accordance with claim 7, wherein the subsidiary patterns are about 0.1 to 0.2 µm wide and about 0.3 to 0.5 µm long.

9. A method of forming a photosensitive film pattern over an uneven topology using an exposure mask having a plurality of light screen patterns, the method comprising the steps of:

providing a U type conductive wiring on a semiconductor substrate;

depositing an insulation layer over the conductive wiring;

depositing a metal layer over the insulation layer; and coating the metal layer with a photosensitive film; and exposing the photosensitive film with a pattern for transferring to the metal film, so that the resulting metal pattern may overlap the conductive wiring at inner sides of opposite ends;

wherein the light screen patterns are so aligned as to cause a part of the metal pattern to overlap the conductive wiring, whereby the intensity of an incident light passing therethrough is reduced.

10. An exposure mask for use with a photosensitive film overlying a deteriorated topology, the mask comprising:

a transparent substrate;

a plurality of light screen patterns disposed on the transparent substrate; and a plurality of subsidiary patterns disposed on the transparent substrate, each of the subsidiary patterns being so small as to avoid forming an attributable photosensitive film pattern, and being positioned between light screen patterns in a position where a necking effect is expected in a pattern exposed in the photosensitive film pattern, for reducing the intensity of incident light at the position.

11. An exposure mask in accordance with claim 10, wherein each of the subsidiary patterns is formed from a chrome layer or a phase shifting element.

12. An exposure mask in accordance with claim 10, wherein each of the subsidiary patterns is about 0.1 to 0.2 µm wide and about 0.3 to 0.5 µm long.

13. A method of forming a photosensitive film pattern over an uneven topology, using an exposure having a plurality of light screen patterns the method comprising the steps of:

providing a U type conductive wiring on a semiconductor substrate, the U type conductive wiring having a base portion and an upright portion disposed at each end of the base portion;

depositing an insulation Layer over the conductive wiring;

depositing a metal layer over the insulation layer;

coating a photosensitive film over the metal layer;

providing subsidiary patterns on the exposure mask, each of the subsidiary patterns lying either between the light screen patterns or at areas overlapping the ends of the base portion, and being so small as to not form a pattern in the photosensitive film, whereby the subsidiary patterns reduce the intensity of light passing therethrough;

exposing the photosensitive layer using the exposure mask in such a way that the metal layer is patterned after the photosensitive film pattern and the resulting metal pattern overlaps the base portion of the U type conductive wiring; and preventing incident light from being diffusely reflected from a slant surface of the uneven topology by use of the subsidiary patterns.

14. An exposure mask in accordance with claim 13, wherein said subsidiary patterns are about 0.1 to 0.2 µm wide and about 0.3 to 0.5 µm long.

15. An exposure mask in accordance with claim 13, wherein said subsidiary patterns are formed from a chrome layer or a phase shifter.

* * * * *